(12) United States Patent
Harrington et al.

(10) Patent No.: US 6,534,775 B1
(45) Date of Patent: Mar. 18, 2003

(54) ELECTROSTATIC TRAP FOR PARTICLES ENTRAINED IN AN ION BEAM

(75) Inventors: Eric R. Harrington, Ipswich, MA (US); Victor M. Benveniste, Gloucester, MA (US); Michael A. Graf, Cambridge, MA (US); Robert D. Rathmell, Exeter, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 141 days.

(21) Appl. No.: 09/654,380

(22) Filed: Sep. 1, 2000

(51) Int. Cl.$^7$ .................. H01J 37/30; H01J 37/147
(52) U.S. Cl. .................. 250/492.21; 250/398
(58) Field of Search ................ 250/492.21, 398, 250/492.2

(56) References Cited

U.S. PATENT DOCUMENTS

| | | | |
|---|---|---|---|
| 3,611,029 A | * | 10/1971 | Stix ..................... 317/4 |
| 4,683,922 A | | 8/1987 | Harrison et al. |
| 5,134,299 A | | 7/1992 | Denholm |
| 5,218,210 A | * | 6/1993 | McIntyre et al. ...... 250/492.2 |
| 5,399,871 A | | 3/1995 | Ito et al. |
| 5,656,092 A | | 8/1997 | Blake et al. |
| 5,670,217 A | | 9/1997 | Blake et al. |
| 5,969,366 A | * | 10/1999 | England et al. ...... 250/492.21 |

FOREIGN PATENT DOCUMENTS

JP  40604493 A  * 2/1994

* cited by examiner

Primary Examiner—Bruce Anderson
(74) Attorney, Agent, or Firm—Eschweiler & Associates, LLC

(57) ABSTRACT

A system for inhibiting the transport of contaminant particles with an ion beam includes a pair of electrodes that provide opposite electric fields through which the ion beam travels. A particle entrained in the ion beam is charged to a polarity matching the polarity of ion beam when traveling through a first of the electric fields. The downstream electrode provides another electric field for repelling the positively charged particle away from the direction of beam travel.

18 Claims, 6 Drawing Sheets

ELECTROSTATIC TRAP FOR PARTICLES ENTRAINED IN AN ION BEAM

TECHNICAL FIELD

The present invention generally relates to inhibiting particle transport in an ion beam and, more particularly to a system and method for providing an electrostatic system for inhibiting transport of microscopic particles within an ion beam.

BACKGROUND

In the manufacture of semiconductor devices, an ion implanter is employed to dope a semiconductor wafer or glass substrate with impurities. In particular, ion beam implanters are used to treat silicon wafers with an ion beam, in order to produce n or p type extrinsic materials doping or to form passivation layers during fabrication of an integrated circuit. When used for doping semiconductors, an ion beam implanter injects a selected ion species to produce a desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway is evacuated to reduce the probability of ions being deflected from the predetermined beam path as a result of collisions with air molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made extremely pure since ions of undesirable molecular weight are deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway, which effectively separates ions of different charge-to-mass ratios.

The ion beam is focused and directed at a desired surface region of the substrate. Typically, the energetic ions of the ion beam are accelerated to a predetermined energy level to penetrate into the bulk of a workpiece. The ions are embedded into the crystalline lattice of the material to form a region of desired conductivity, with the beam energy determining the depth of implantation. Examples of ion implantation systems include those available from Axcelis Technologies of Beverly, Mass.

Operation of an ion implanter or other ion beam equipment (e.g., linear accelerators) may result in the production of contaminant particles. The contaminant particles, for example, may be less than about 1 µm in size. The momentum of the ions in the beam that strike the particles, in turn, cause the particles to be transported with the beam, although typically at a speed much less than the ions. Consequently, particles entrained in an ion beam may be transported with the beam toward the wafer (or other substrate), resulting in undesired contamination at the wafer.

In an ion implantation system, for example, one source of contaminant particles is photoresist material. Photoresist material is coated on wafer surfaces prior to implantation and is utilized to define circuitry on the completed integrated circuit. As ions strike the wafer surface, particles of photoresist coating may be dislodged from the wafer and may become entrained in the ion beam. Contaminant particles that collide with and adhere to a semiconductor wafer or other substrate during ion implantation may be a source of yield loss in the fabrication of semiconductor and other devices that require submicroscopic pattern definition on the treated wafers.

As semiconductor devices are manufactured at reduced sizes with greater precision, higher accuracy and efficiency are required of apparatuses for manufacturing such semiconductor devices. Accordingly, it is desirable to reduce the level of contaminant particles in an ion beam so as to mitigate wafer contamination.

SUMMARY

The present invention relates to a system and method for inhibiting the transport of a particle entrained in an ion beam. The particle within an ion beam is charged to a polarity during a first region of the system. A first electric field helps Another electrode downstream from the first electric field provides an electric field opposite the first electric field and provides a potential barrier, which repels the charged particle. As a result, the charged particle may be urged away from the direction of beam travel, suitably out of the ion beam. The potential barrier, for example, may urge a charged particle into an electrode where it, in turn, discharges to a neutral potential or to a location where it is unlikely to bounce back into the beam path. As a result, particles may be trapped or diverted from an ion beam in accordance with the present invention, thereby mitigating contamination of a workpiece.

Another aspect of the present invention provides a system for inhibiting transport of particles with an ion beam. The system includes a first electrode that provides a first electric field having a first polarity opposite that of the ion beam. A particle entrained in the ion beam within the first electric field is charged to a polarity matching the ion beam. A second electrode is located downstream in a direction of travel for the ion beam relative to the first electrode. The second electrode provides an electric field having a polarity matching the ion beam for repelling the charged particle away from the downstream direction of travel.

Yet another aspect of the present invention provides a system for inhibiting the transport of particles with an ion beam. The system includes a negative electrode that provides a negative electric field, which positively charges a particle entrained in the ion beam. A positive electrode is located downstream relative to the negative electrode. The positive electrode provides a positive electric field for repelling the positively charged particle away from the direction of travel.

Another aspect of the present invention provides an ion implantation system. The system includes an ion source for emitting ions to treat a substrate located at a downstream implantation station. An analyzing magnet system diverts ions of an appropriate mass to an implantation trajectory. A trap system inhibits transport of particles with the diverted ions from the analyzing magnet system. The trap system includes a first electrode that provides a first electric field having a first polarity opposite that of the ion beam. A particle entrained in the ion beam is charged to a polarity matching an ion beam formed of the diverted ions. A second electrode located in a downstream direction of travel for the ion beam relative to the first electrode provides an electric field having a polarity opposite the first electric field for repelling the charged particle. A substrate is supported at the implantation station for treatment with the ions provided by the trap system. As a result, particle contamination of the substrate is mitigated by the trap system.

Still another aspect of the present invention provides a method for inhibiting transport of particles with an ion beam. The method includes generating a first electric field in the path of the ion beam and charging particles located in the ion beam in a region of the first electric field with a polarity matching the ion beam. A second electric field is generated in the path of the ion beam downstream relative the first electric field. The second electric field has a polarity opposite the first electric field so as to repel at least some of the charged particles away from the ion beam.

Another aspect of the present invention provides a system for inhibiting transport of particles with an ion beam. The system includes at least one electrode energized to provide a negative electric field through which the ion beam travels. A particle entrained in the ion beam positively charges within the negative electric field and, in turn, is unable to pass through the system due to attractions provided by a negative potential well for the positively charged particles.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DESCRIPTION OF THE INVENTION

The present invention provides a system and method for removing contaminant particles from an ion beam, such as may be utilized in conjunction with an ion implanter system.

It will be appreciated, however, that the present invention has broader application than for use with an ion implanter, as it may be employed to remove contaminant particles from an ion beam in applications other than those described herein. Moreover, while the examples illustrated and described with respect to FIGS. 1–6 may be configured for removing particles from a positive ion beam, those skilled in the art will understand and appreciate that the present invention is equally applicable to a negative ion beam.

Figure 1:
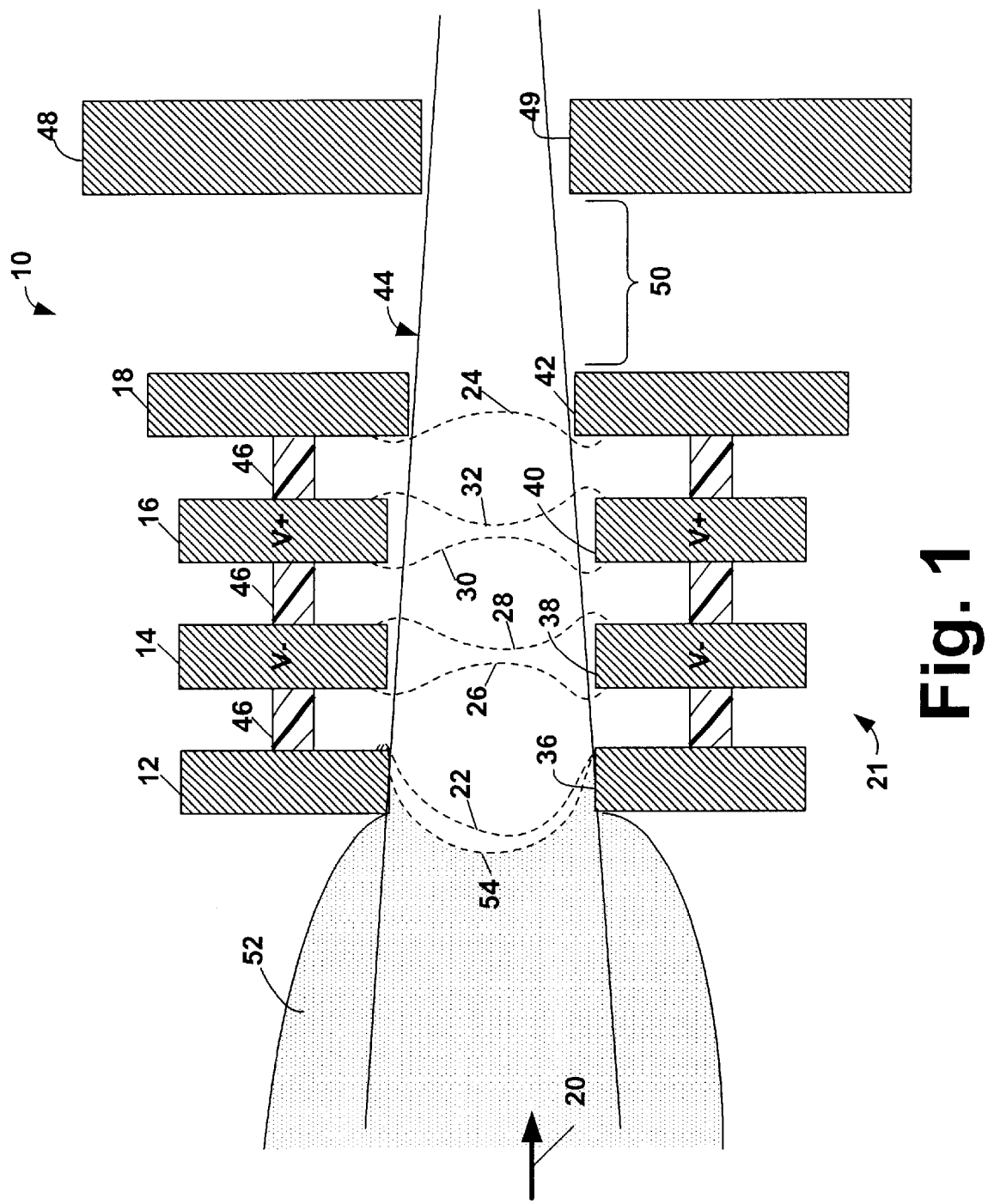
FIG. 1 is a side sectional view of a particle trap system in accordance with the present invention.

FIG. 1 illustrates a particle trap system 10 in accordance with an aspect of the present invention. The system 10 includes an arrangement of electrodes 12, 14, 16, and 18 arranged linearly in a beam direction, indicated at 20. The electrodes 12, 14, 16, and 18 form an electrode assembly 21. In particular, the electrodes 12 and 18 are ground electrodes maintained at a relative ground potential in the system 10. The electrodes 12 and 18 thus provide neutral electric fields, indicated by field lines 22 and 24, respectively. The electrode 14 is a negative electrode that generates a negative electric (or electrostatic) field relative to ground potential, indicated by field lines 26 and 28. A suitable DC source (not shown) is electrically coupled to the electrode 14 for providing negative electrical energy to the electrode at a desired level. The electrode 16 is a positively charged electrode that generates a positive electric (or electrostatic) field relative to ground potential. The positive electric field is indicated by field lines 30 and 32. A suitable DC source (not shown) is electrically coupled to the electrode 16 for providing positive electrical energy to the electrode.

By way of example, each of the electrodes 12, 14, 16, 18 is an annular plate having a respective aperture 36, 38, 40, 42 that circumscribes an ion beam 44 passing substantially coaxially through the apertures. Each of the electrodes 12, 14, 16, 18 is spaced from its adjacent electrode(s) by a spacer 46 formed of an electrically insulating material. The thickness of the spacer 46 and, in turn, the distance between electrodes may be selected based on, for example, the relative voltage potentials provided to the respective plates, the energy of the ion beam 44, and other system constraints.

In accordance with one aspect of the present invention a variable resolving electrode 48 may be located downstream from and electrically isolated relative to the ground electrode 18. The variable resolving electrode 48 includes an aperture (a variable resolving aperture) 49 through which the ion beam 44 passes. The variable resolving electrode 48, for example, is at a sufficiently large voltage potential relative to the adjacent ground electrode 18 so as to accelerate the ions in the ion beam 44 intermediate the electrodes 18 and 48. For example, the variable resolving electrode 48 may be at about 40 KV relative to the ground electrode 18 so as to provide a large acceleration field 50 for accelerating ions in the ion beam 44.

The ground electrode 12 operates to clamp the electric fields generated by the electrodes 14 and 16. When the trap system 10, for example, receives the Ion beam 44 from a mass analysis magnet system, the ground electrode 12 inhibits interactions between the magnetic field of the magnet system and the electric fields of the trap system.

A sheath of plasma 52, consisting of ions and electrons, exists outside of the electric fields provided by the trap system 10. The plasma sheath 52 tends to neutralize space charge caused by the ion beam 44, thereby largely eliminating transverse electric fields that might otherwise disperse the beam. The plasma sheath enhances beam containment. The ion beam 44 and the plasma sheath 52 move in the beam direction 20 and interact with the negative electric field provided by the negative electrode 14. The negative electric field provided by the negative electrode 14 extinguishes (or blows off) the plasma sheath 52 thereby forming a boundary 54 between the plasma sheath and the electric fields (e.g., a transition from a region with plasma to a region without plasma). The absence of the plasma sheath 52 within the electrode assembly 21 creates an environment more conducive to trapping or diverting a particle relative to the ion beam 44 in accordance with an aspect of the present invention. The neutral electrode 12, which is at ground potential, inhibits downstream travel of plasma into the electric field region provided by at least one of the first and second electrodes, thereby enhancing the transition from the plasma region to the electric field region.

Ion beams may be characterized as a weak plasma consisting of fast ions, plus slow ions and electrons generated by collisions with residual gas and objects near the beam path. The "plasma" tends to reduce the repulsive forces of the ions in the beam which tend to all charge to the same sign. Microscopic contaminant particles moving in a beam plasma may become negatively charged, because the electron flux can be higher than the positive ion flux striking such particles. When such a beam enters an electric field having a potential greater than the electron energy, electrons tend not to follow the ion beam. In such a region, microscopic particles become positively charged due to collisions of fast ions. A negative electrode that generates this electric field helps ensure that the entrained particles become positively charged.

Figure 2:
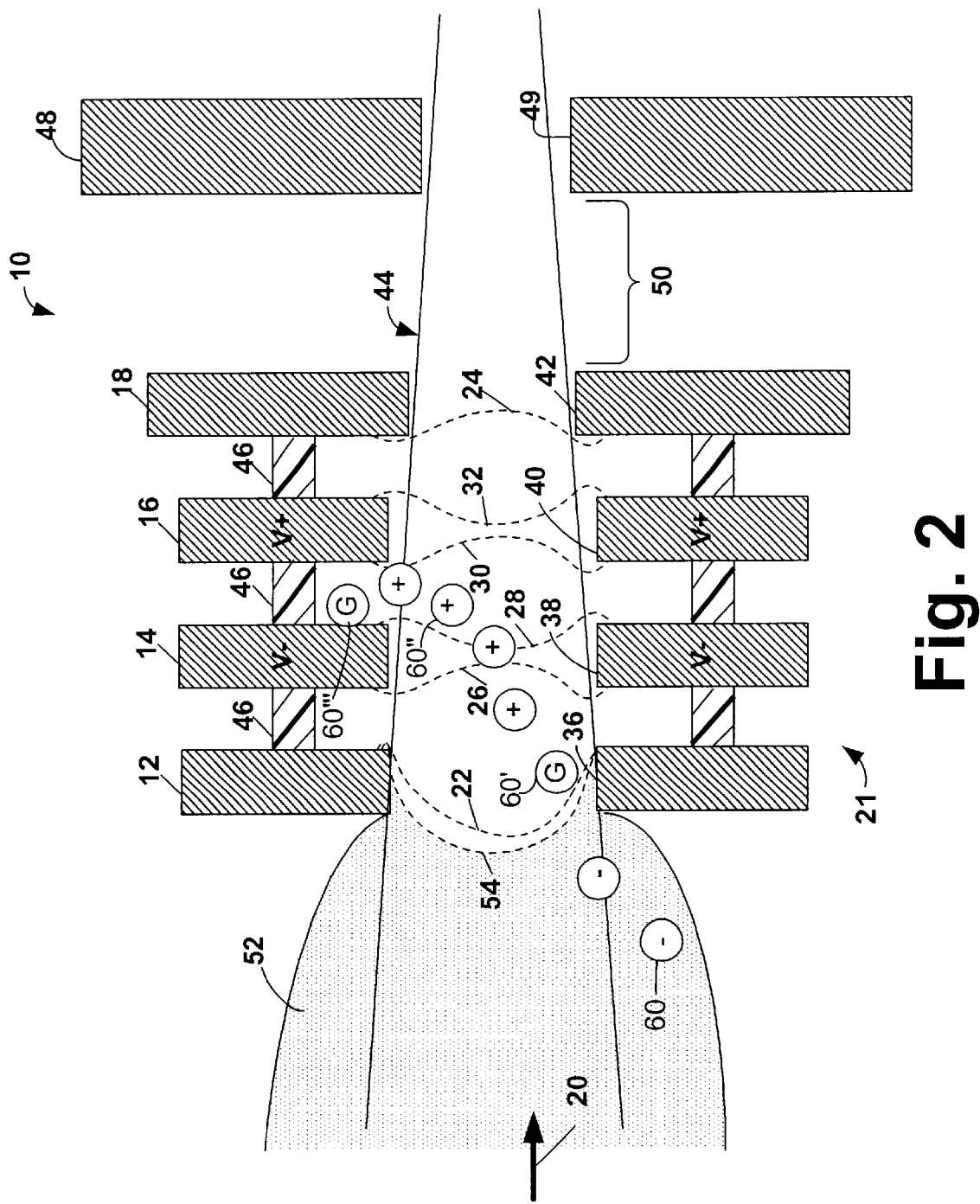
FIG. 2 is another view of the system of FIG. 1, illustrating an example of a particle trajectory in accordance with the present invention.

FIG. 2 illustrates an example of a trajectory for a particle 60 in the system 10 of FIG. 1, in which identical reference numbers refer to parts previously identified with respect to FIG. 1. Particles typically travel in the ion beam at several orders of magnitude slower than the ions of the beam. Consequently, movement of a particle 60 with the beam 44 is due, at least in part, to the transfer of momentum from the ions of the beam to the particle.

By way of example, the particle 60 begins its trajectory at a location within the plasma sheath 52 outside of the ion beam 44. The relatively fast electrons in the plasma sheath 50 impart a negative charge on the particle 60, as numerous electrons hit the particle. Thus, the particle 60 assumes a negative charge from the plasma sheath 52. The ions in the ion beam 44 are moving downstream at orders of magnitude faster than the particle 60. As the particle 60 enters the ion beam 44, the momentum of the ions urges the particle in the beam direction 20 and through the boundary 54.

The ion beam 44, which in this example is a positive ion beam, has a positive electric field associated therewith due to the numerous positively charged ions traveling in the beam. The negative electric field between 22 and 26 also repels electrons and attracts positive ions. In the absence of the plasma sheath 52 within the electrode assembly 21, the ions of the beam 44 hit the particle with sufficient frequency and velocity to positively charge the particle 60. Accordingly, the particle 60 begins to change signs from negative (when in the plasma sheath 52) to neutral 60', as illustrated in FIG. 2. Because the mass of the particle 60' is much greater than the ions in the beam 44, the particle is able to accumulate a much greater positive charge in response to being bombarded with the rapidly moving positive ions. As a result, the ions of the beam 44 continue to positively charge the particle 60' and move it in a downstream direction, such that it begins to accumulate more of a positive charge 60".

By the time the particle 60" reaches the positive electric field provided by the positive electrode 16, the particle is sufficiently positively charged so as to be repelled by the positive electric field. As illustrated in the example in FIG. 2, the particle 60" is urged away from the direction of beam travel and into contact with the negative electrode 14. The contact with the negative electrode 14 causes the particle 60'" to discharge to a neutral charge. The neutral particle 60'", in turn, may fall out of the beam. Alternatively, a repelled particle may be recycled within the system 10 and eventually become neutral and fall.

Figure 3:
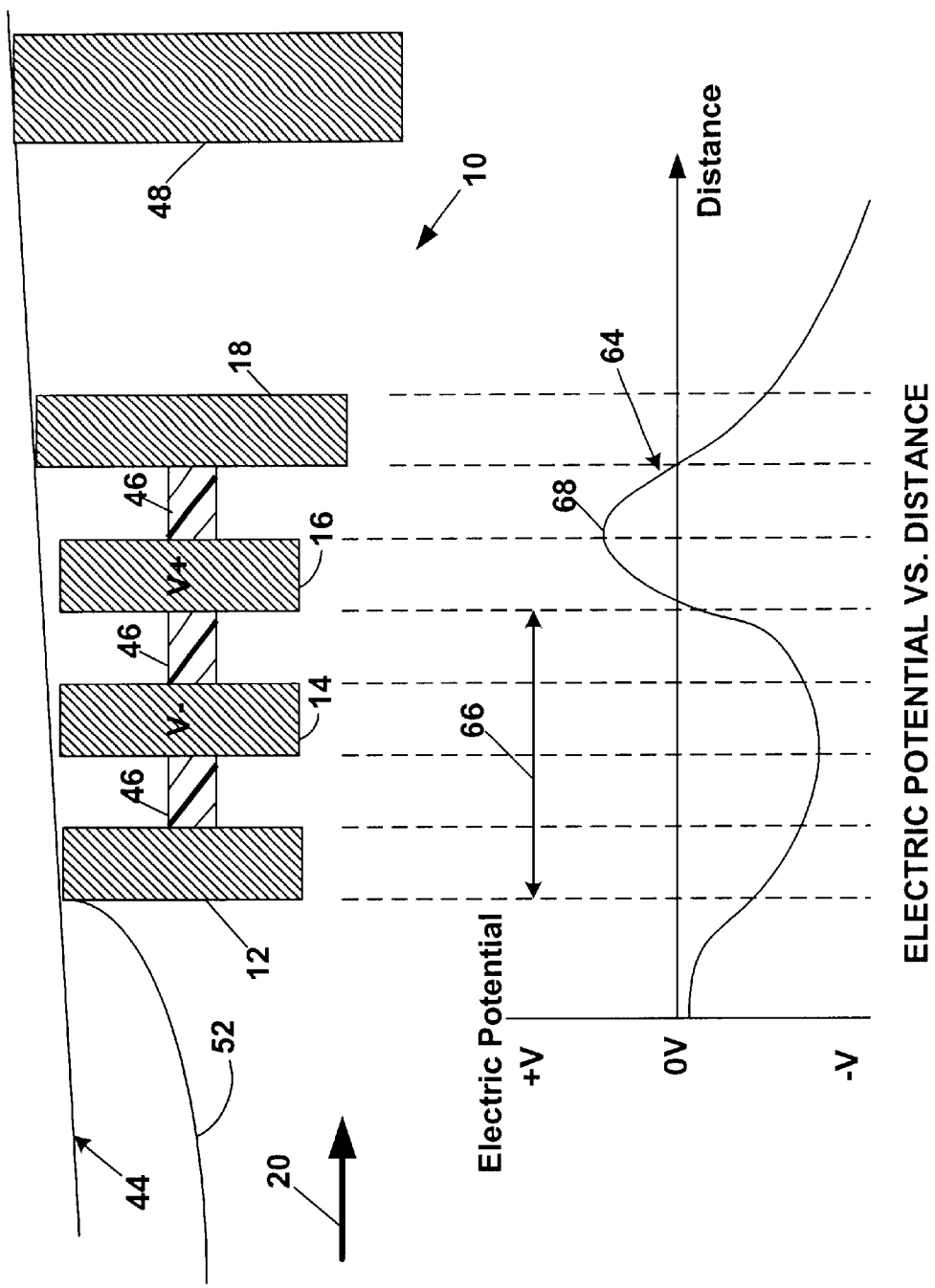
FIG. 3 is graphical representation of an electrostatic field potential through the system of FIG. 1.

FIG. 3 illustrates an exemplary graphical representation 64 of the electric potential provided by the system 10 of FIG. 1 as a function of distance in the beam direction 20. That is, the graph 64 shows the electric potential that a particle (as well as the ion beam 44) is exposed to in the system 10. For sake of brevity, identical reference numbers refer to parts previously identified with respect to FIG. 1.

As mentioned above, the plasma sheath 52 has a fast electrons, which causes a particle also to take on a slightly negative charge prior to entering the electric fields of the electrode assembly. The negative electrode 14 provides a negative electric field that pushes away electrons and attracts positive ions. The negative electric field also forms a negative potential well over a path length 66. Once in the negative well, particles usually are sufficiently positive such that they are repelled by the increasingly positive exit potential 68, which is generated by the positive electrode 16. In particular, the particle charge may be about 180 degrees out-of-phase with the potential provided in the electric field region. That is, the particle has a large positive charge when it is within the negative potential well. As a result, the particle is unable to continue downstream, as it does not have sufficient kinetic energy to get out of the negative potential well and over the positive potential "hump" provided by the positive electrode 16.

It is to be appreciated that the particle trap function, in accordance with an aspect of the present invention also may be implemented by a single electrode. For example, the electrode 16 may be set to a negative potential (V−) that is substantially identical to that of the electrode 14. In this way, particles entrained in the ion beam are positively charges within the negative electric field and, in turn, is unable to pass through the system due to attractions provided by a negative potential well that operating on the positively charged particles. The particle trapping function further may be enhanced by utilizing multiple electrodes and/or a segmented electrode, as particles would tend to collect in spaces between electrodes (or the segments thereof). As a result, particles may enter such spaces and mitigate reentry into the ion beam and further downstream travel of such particles.

Figure 4:
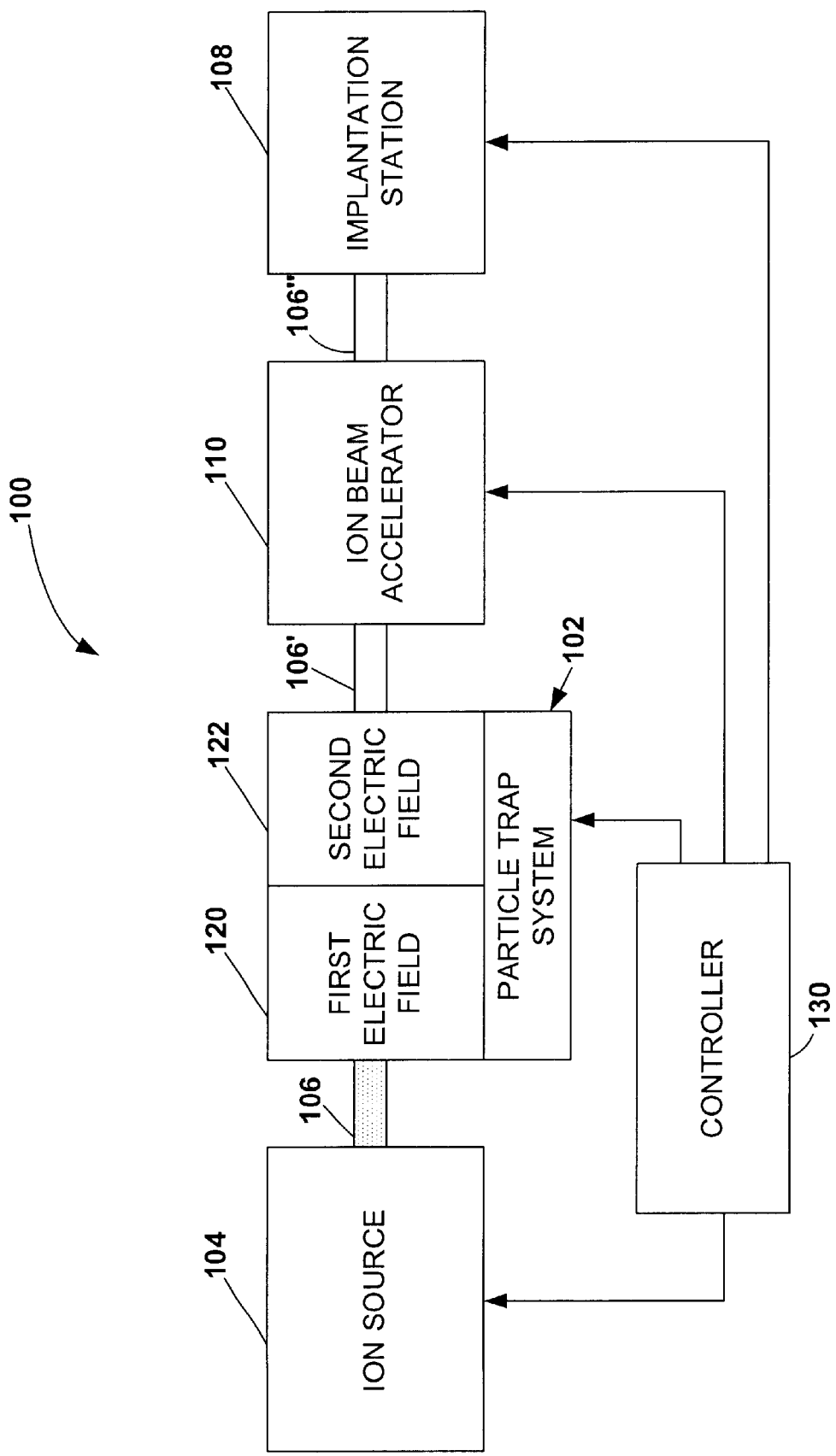
FIG. 4 is a schematic block representation of an ion implantation system employing a particle trap system in accordance with the present invention.

FIG. 4 is schematic block representation of an ion beam processing system 100 employing a particle trap system 102 in accordance with an aspect of the present invention. By way of example, the system 100 may be an ion implantation system, a particle accelerator, or other system employing an ion beam in which it may be desirable to remove and/or divert contaminant particles.

The system 100 includes an ion source 104 that emits ions that form an ion beam 106. The ion source 104 includes a chamber into which source materials, such as an ionizable gas or vaporized materials, are injected. Energy is applied to the source materials to generate ions that, in turn, exit the chamber to form the ion beam 106 (positive or negative). Ion sources are well known to those skilled in the art and details concerning such sources are, therefore, omitted for sake of brevity. An example of an ion source that employs microwave energy to ionize source materials is disclosed in U.S.

Pat. No. 5,523,652, which is incorporated herein by reference. Those skilled in the art will understand and appreciate that other ion sources, which may or may not undergo additional processing, may be utilized as an ion source for use in conjunction with a particle trap system 102 in accordance with an aspect of the present invention.

The ion beam 106 traverses a distance from the ion source 104 to a processing station 108. Prior to processing or as part of the processing station, the ion beam 106 also may pass through an ion beam accelerator 110.

In accordance with an aspect of the present invention, the ion source 104 provides the beam 106 to the particle trap system 102. The trap system 102 employs a first electric field 120 having a polarity opposite that of the ion beam and a second electric field 122 having a polarity matching that of the ion beam to facilitate removal of particles entrained in the ion beam 106. By way of example, the trap system 102 includes an electrode assembly having negative and positive electrodes located next to each other for providing the respective negative and positive electric fields. If the particle trap system 102 is positioned adjacent a source of a magnetic field, ground electrodes further may be utilized to inhibit interactions between the magnetic and electric fields, such as shown and described with respect to the electrode assembly 21 of FIG. 1.

By way of example, when a positive ion beam is employed, the first electric field 120 is negative and the next downstream electric field 122 is positive. The negative electric field 120 extinguishes (or blows off) a plasma sheath adjacent the particle trap system 102 through which the ion beam 106 passes. This establishes a barrier between the plasma sheath and the region within the trap system 102. The absence of the plasma creates an environment within the trap system 102 that facilitates the particle trapping function in accordance with an aspect of the present invention. The numerous ions of the ion beam 106, which move downstream much more quickly than the particles, positively charge particles entrained in the beam 106. Accordingly, a particle may accumulate a large positive charge by the time it reaches the positive electric field 122. As a result, the positive electric field 122 repels the positively charged particles away from the downstream direction of travel for the ion beam, effectively preventing their continued transport with the ion beam 106' as it exits the trap system 102. Advantageously, divergence of the ion beam is small relative to particle divergence.

The beam 106' may then be provided to the ion beam accelerator system 110 or other analysis or processing systems (e.g., mass analysis, focusing). The ion beam acceleration system 110, for example, is formed of a group of electrodes that establish a voltage gradient along the beam axis for selectively accelerating and/or decelerating the beam to a desired energy level. Acceleration/deceleration electrodes further may be employed to focus the ion beam 106' to provide a focused, accelerated beam 106" having a substantially uniform intensity over a target area.

The accelerated beam 106" is provided to the processing station 108. By way of example, the processing station 108 may be an implantation station (for ion implantation), an analysis station (for substrate analysis), or other systems that may employ an ion beam.

A controller 130 may be operatively associated with each of the ion source 104, the particle trap system 102, the ion beam accelerator 110, and the processing station 108. The controller 130 may monitor and control the ion beam characteristics provided to the processing station. The controller 130 may be formed of hardware and/or software programmed and/or configured to implement desired control functionality with respect to the various parts of the system 100 to control parameters of the ion beam 106.

Figure 5:
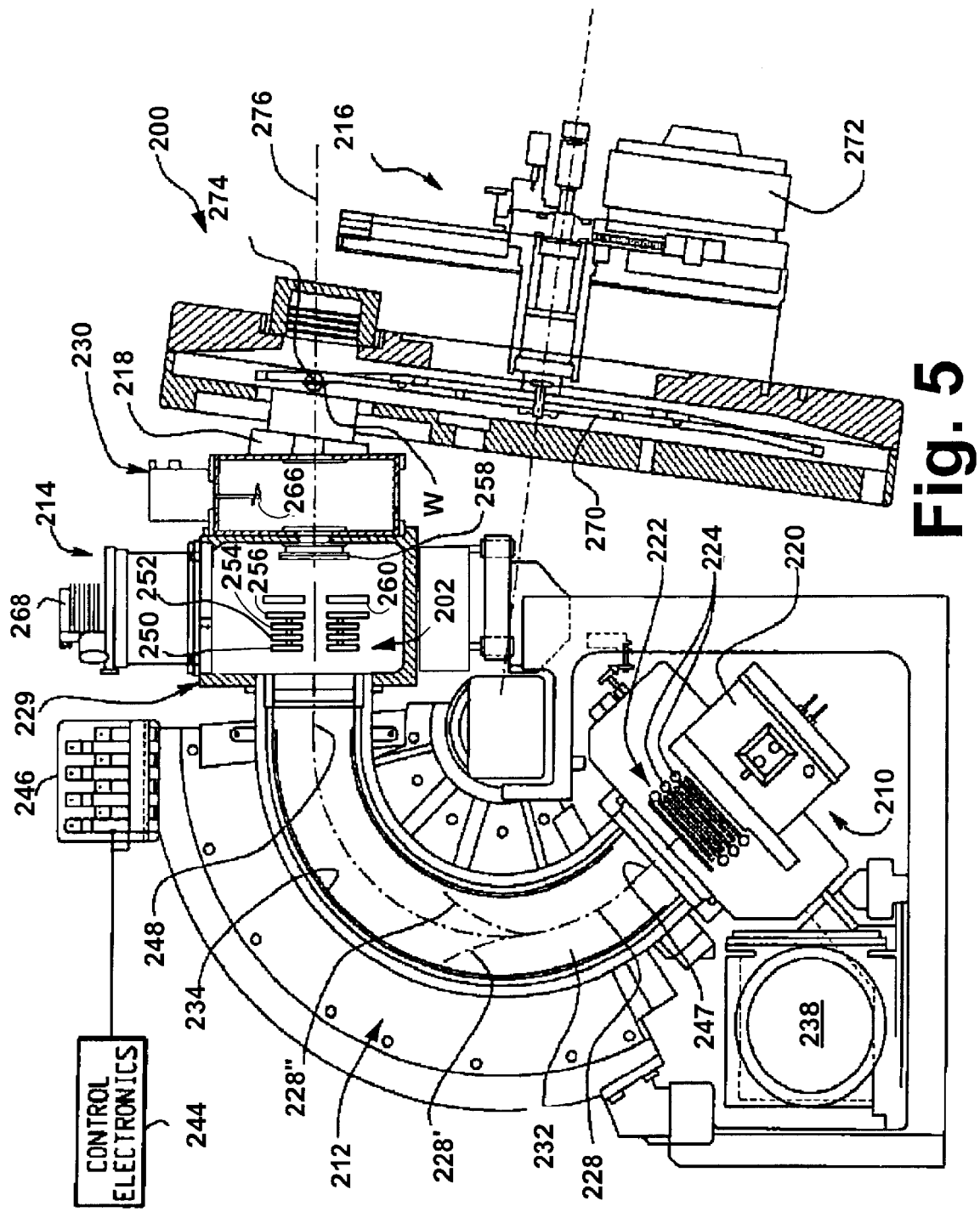
FIG. 5 is a partial sectional view of an example of an ion implantation system employing a particle trap system in accordance with the present invention.

In order to provide additional context for the present invention, FIG. 5 illustrates an example of an ion implantation system 200 configured to employ a trap system 202 in accordance with an aspect of the present invention. The ion implantation system 200 includes an ion source 210, a mass analysis magnet 212, a beamline assembly 214, and a target or end station 216. An expansible stainless steel bellows assembly 218, which permits movement of the end station 216 with respect to the beamline assembly 214, connects the end station 216 and the beamline assembly 214. Although FIG. 5 illustrates an example of an ultra low energy (ULE) ion implantation system, a particle trap, in accordance with the present invention, has applications in other types of implanters as well.

The ion source 210 comprises a plasma chamber 220 and an ion extractor assembly 222. Energy is imparted to an ionizable dopant gas to generate ions within the plasma chamber 120. Generally, positive ions are generated, although the present invention is applicable to systems wherein negative ions are generated by the source 212. The positive ions are extracted through a slit in the plasma chamber 220 by the ion extractor assembly 222, which comprises a plurality of electrodes 224. The electrodes 224 are charged with negative potential voltages, increasing in magnitude as the distance from the plasma chamber slit increases. Accordingly, the ion extractor assembly 222 functions to extract a beam 228 of positive ions from the plasma chamber 220 and to accelerate the extracted ions into the mass analysis magnet 212.

The mass analysis magnet 212 functions to pass ions having an appropriate charge-to-mass ratio to the beamline assembly 214, which comprises a resolver housing 229 and a beam neutralizer 230. The mass analysis magnet 212 includes a curved beam path 232 defined by an aluminum beam guide 234 having arcuate cylindrical side walls, evacuation of which is provided by a vacuum pump 238. The ion beam 228 that propagates along this path 232 is affected by the magnetic field generated by the mass analysis magnet 212 to reject ions of an inappropriate charge-to-mass ratio. The strength and orientation of this dipole magnetic field is controlled by control electronics 244, which adjust the electrical current through the field windings of the magnet 212 through a magnet connector 246.

The dipole magnetic field causes the ion beam 228 to move along the curved beam path 232 from a first or entrance trajectory 247 near the ion source 210 to a second or exit trajectory 248 near the resolving housing 224. Portions 228' and 228" of the beam 228 (comprised of ions having an inappropriate charge-to-mass ratio) are deflected away from the curved trajectory and into the walls of an aluminum beam guide 234. In this manner, the magnet 212 passes to the resolving housing 224 only those ions in the beam 228 that have the desired charge-to-mass ratio.

By way of example the trap system 202 is positioned in the resolving housing 229, although it is to be appreciated that the trap system may, in accordance with the present invention, be located in other parts of the ion implantation system 200. It may be desirable to position the trap system prior to acceleration of the ion beam (if utilized) so that increased field strengths are not required to provide an adequate potential barrier to impede transport of accelerated contaminant particles in the beam.

The trap system 202 includes an arrangement of electrodes 250, 252, 254, and 256 arranged linearly between the mass analysis magnet 212 and a dosimetry indicator, such as a Faraday flag 258. The electrodes 250 and 256 are ground electrodes configured to provide neutral electric fields. The electrode 252 is a negative electrode that provides negative electric field relative to ground potential. The electrode 254 is a positively charged electrode that generates a positive electric field relative to ground potential.

The ground electrode 250 operates to clamp the electric fields generated by the electrodes 252 and 254 and inhibit interactions between the magnetic field of the mass analysis magnet 212 and the electric fields generated by the trap system 202. A plasma sheath exists between the mass analysis magnet 212 and the trap system 202 through which the beam 228 passes. The negative electric field generated by the negative electrode 252 extinguishes the plasma sheath 52, which creates an environment more conducive to trapping and/or diverting contaminant particles in accordance with an aspect of the present invention. Also, the negative electric field forms a barrier for electrons in the beam plasma, so they tend not to be pulled out of the plasma by the positive electrode.

The negative electric field further positively charges particles entrained in the beam 228, such that the particles take on a positive charge. By the time the particles reach the positive electric field provided by the positive electrode 254, the particles are sufficiently positively charged so as to be repelled by the positive electric field (see, e.g., FIG. 2). The particles may be urged out of the beam and into contact with an electrode, e.g., the electrode 14, which contact causes the particles to discharge to a neutral charge. The neutral particles, in turn, may fall out of the beam to a reduced state of kinetic energy. Repelled particles also may be recycled within the system 200 and, in turn, become neutral and fall from the beam 228. A particle may pass through the trap system 202, however, if it has sufficient energy to pass through the positive potential barrier. Of course the field strengths may be increased if particle contamination persists above specification levels. The positive electrode 254 and exit ground electrode 256 may form an electrostatic lens for focusing and/or accelerating the ion beam 228. Additional acceleration may (optionally) be implemented by providing a variable resolving aperture electrode 260 that is at high voltage potential relative to the ground electrode 256.

The beam neutralizer 230 may include a plasma shower 266 for neutralizing the positive charge that may accumulate on the target wafer as a result of being implanted by the positively charged ion beam 240. The beam neutralizer 230 and resolver housing 229 are evacuated by a vacuum pump 268.

Downstream of the beam neutralizer 230 is the end station 216, which includes a disk-shaped wafer support 270 upon which wafers to be treated are mounted. The wafer support 270 resides in a target plane, which is generally perpendicularly oriented relative to the direction of the implant beam. A motor 272 rotates the disc shaped wafer support 270 at the end station 216. The ion beam thus strikes wafers mounted to the support as they move in a circular path. The end station 216 pivots about point 274, which is the intersection of the path 276 of the ion beam and the wafer W, so that the target plane is adjustable about this point.

Figure 6:
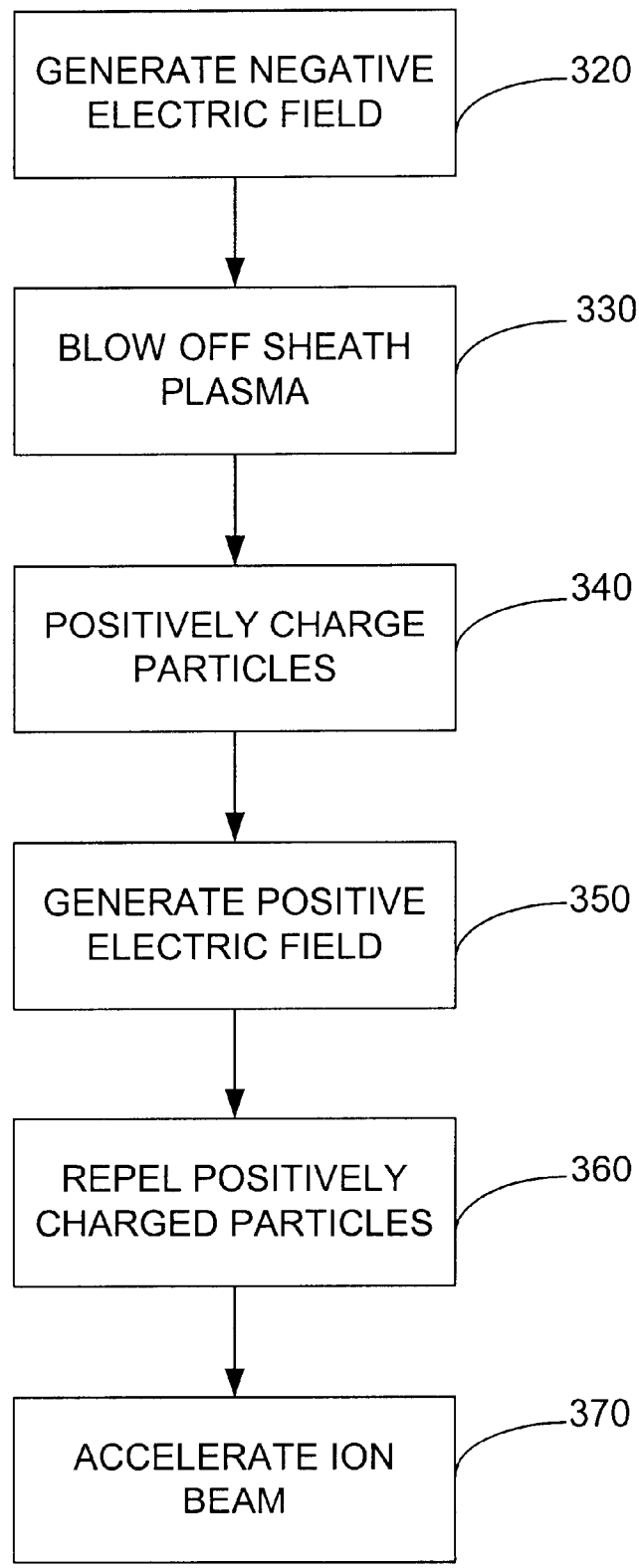
FIG. 6 is a flow diagram illustrating a methodology for inhibiting the transport of particles in an ion beam.

FIG. 6 is a flow diagram illustrating an example of a methodology for inhibiting particle transport in an ion beam in accordance with an aspect of the present invention. While, for purposes of simplicity of explanation, the methodology of FIG. 6 is shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect of the present invention.

Briefly stated, a methodology in accordance with an aspect of the present invention employs a pair of opposite electric fields through which an ion beam is directed. The polarity of the electric fields may vary according to whether a positive or negative ion beam is utilized. A first electric field is generated in the path of the ion beam, which electric field has a polarity opposite that of the ion beam. Particles located in the ion beam within a region of the first electric field are charged with a polarity matching the ion beam. A second electric field is generated in the path of the ion beam downstream relative the first electric field. The second electric field has a polarity opposite the first electric field, so as to repel at least some of the charged particles away from the ion beam.

Referring to FIG. 6, the illustrated methodology begins at step 320 in which a negative electric field is generated, such as by charging an electrode with an appropriate negative voltage potential relative to ground potential. The negative electric field operates to extinguish a sheath of plasma (step 330) through which the ion beam is passing. The plasma sheath provides an environment that causes particles to also take on a negative charge. The particles and ions continue to move downstream in the beam direction in the absence of the plasma sheath.

At step 340, the particles begin to take on a positive charge due to the interactions with the negative electric field. Next, at step 350, a positive electric field is generated adjacent and downstream relative to the negative electric field. The positive electric field repels the positively charged contaminant particles (step 360). In particular, the positive electric field operates to slow down and change the trajectory of positively charged particles. Advantageously, the particles usually are unable to pass through the positive electric field or change trajectory enough so that they are unable to hit an associated substrate (e.g., a wafer). As a result, particle contamination of the substrate is mitigated.

After the particles have been repelled (either out of the ion beam or on a modified trajectory), the process may proceed to step 370. At step 370, the ion beam may be accelerated to a desired energy level, such as by providing a suitable electric field gradient commensurate with the level of acceleration desired. It is to be appreciated that acceleration may occur prior to trapping the particles or acceleration may not be employed altogether, in accordance with an aspect of the present invention.

Although the invention has been shown and described with respect to a certain embodiments, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary embodiments of the invention. In this regard, it will also be recognized that the invention includes a computer-readable medium having computer-executable instructions for performing the steps of the various methods of the invention. In addition, while a particular feature of the invention may have been disclosed with respect to only one of several embodiments, such feature may be combined with one or more other features of the other embodiments as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising."

What is claimed is:

1. A system for inhibiting transport of particles with an ion beam comprising:
   a first electrode that provides a first electric field having a first polarity opposite that of the ion beam, a particle entrained in the ion beam within the first electric field being charged to a polarity matching the ion beam; and
   a second electrode located downstream in a direction of travel for the ion beam relative to the first electrode, the second electrode providing an electric field having a polarity matching the-ion beam for repelling the charged particle away from the downstream direction of travel.

2. The system of claim 1 further including a ground electrode spaced upstream relative to the first electrode for inhibiting downstream travel of plasma into the electric field provided by at least one of the first and second electrodes.

3. The system of claim 1, wherein the first electric field is a negative electric field that forms a negative potential well, and the second electric field is a positive electric field that forms a positive potential barrier adjacent the negative potential well, whereby the positive potential barrier inhibits further downstream travel of the charged particle.

4. A system for inhibiting transport of particles with a positive ion beam comprising:
   a negative electrode that provides a negative electric field, a particle entrained in the ion beam within a region of the negative electric field being charged to a positive polarity; and
   a positive electrode adjacent the negative electrode in a downstream direction of travel for the ion beam, the positive electrode providing a positive electric field for repelling the positively charged particle away from the direction of travel.

5. The system of claim 4 further including a first ground electrode spaced upstream from and generally adjacent relative to the negative electrode for inhibiting downstream travel of plasma into the electric field provided by at least one of the negative and positive electrodes.

6. The system of claim 5 further including a second ground electrode spaced downstream from and generally adjacent relative to the positive electrode, the ground electrodes collectively clamping the electric fields provided by the positive and negative electrodes.

7. The system of claim 4, wherein each of the positive and negative electrodes comprises an annular electrode having a central aperture extending substantially coaxially therethrough, the ion beam passing through the apertures of the annular electrodes.

8. An ion implantation system comprising:
   an ion source for emitting ions to treat a substrate located at an implantation station;
   an analyzing magnet system for diverting ions of an appropriate mass to an implantation trajectory;
   a trap system for inhibiting transport of particles with the diverted ions from the analyzing magnet system, the trap system comprising:
      a first electrode provides a first electric field having a first polarity opposite that of the ion beam, a particle entrained in the ion beam being charged to a polarity matching an ion beam formed of the diverted ions; and
      a second electrode located in a downstream direction of travel for the ion beam relative to the first electrode, the second electrode providing an electric field having a polarity opposite the first electric field for repelling the charged particle; and
   a substrate supported at the implantation station for treatment with ions from the trap system, whereby particle contamination at the substrate is mitigated.

9. The system of claim 8, wherein the trap system further includes a first ground electrode spaced upstream from and adjacent relative to the first electrode for inhibiting downstream travel of plasma into the electric field provided by at least one of the first and second electrodes.

10. The system of claim 9, wherein the trap system further includes a second ground electrode spaced downstream from and adjacent relative to the positive electrode, the ground electrodes collectively clamping the electric fields provided by the positive and negative electrodes.

11. The system of claim 10, wherein each of the electrodes comprises an annular electrode having a central aperture extending substantially coaxially therethrough, the diverted ions passing through the apertures of each annular electrode.

12. The system of claim 10 further including an acceleration electrode spaced downstream relative to the second ground electrode, the acceleration electrode being at a voltage potential sufficient to accelerate the ions to a desired energy level for treatment at the implantation station.

13. A system for inhibiting transport of particles with an ion beam comprising:
   means for generating a first electric field in a path of the ion beam, a particle entrained in the ion beam when within the first electric field being charged to a polarity matching the ion beam; and
   means for generating a second electric field in the path of the ion beam downstream from and having a polarity opposite the first electric field to the first electric field, the second electric field urging the charged particle away from the path of the ion beam.

14. The system of claim 13 further including means for inhibiting interaction between an adjacent magnetic field and at least one of the first and second electric fields.

15. The system of claim 13, wherein each of the means for generating includes a central aperture extending substantially coaxially through an annular electrode thereof, the ion beam passing through the apertures.

16. A method for inhibiting transport of particles with an ion beam, the method comprising the steps of:
   generating a first electric field in the path of the ion beam;
   charging particles located in the ion beam in a region of the first electric field with a polarity matching the ion beam; and
   generating a second electric field in the path of the ion beam downstream relative the first electric field, the second electric field having a polarity opposite the first electric field so as to repel at least some of the charged particles away from the ion beam.

17. The method of claim 16 further including generating a neutral potential electric field between the negative electric field and an adjacent magnetic field so as to inhibit downstream travel of plasma into the first electric field.

18. The method of claim 17 further including clamping the first and second electric fields within a trap region.

* * * * *

UNITED STATES PATENT AND TRADEMARK OFFICE
CERTIFICATE OF CORRECTION

PATENT NO. : 6,534,775 B1 Page 1 of 1
DATED : March 18, 2003
INVENTOR(S) : Eric R. Harrington et al.

It is certified that error appears in the above-identified patent and that said Letters Patent is hereby corrected as shown below:

Column 12,
Line 46, please insert the word -- relative -- after the word "field".

Signed and Sealed this

Sixth Day of May, 2003

JAMES E. ROGAN
*Director of the United States Patent and Trademark Office*